US012561206B2

(12) United States Patent
Leong et al.

(10) Patent No.: US 12,561,206 B2
(45) **Date of Patent: *Feb. 24, 2026**

(54) STABILITY TESTING FOR MEMORY OVERCLOCKING

(71) Applicant: Advanced Micro Devices, Inc., Santa Clara, CA (US)

(72) Inventors: Alicia Wen Ju Yurie Leong, Austin, TX (US); William Robert Alverson, Del Valle, TX (US); Joshua Taylor Knight, Georgetown, TX (US); Jerry Anton Ahrens, Sister Bay, WI (US); Grant Evan Ley, Eden, UT (US); Anil Harwani, Austin, TX (US); Amitabh Mehra, Fort Collins, CO (US); Jayesh Hari Joshi, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/974,981

(22) Filed: Oct. 27, 2022

(65) Prior Publication Data

US 2024/0143445 A1 May 2, 2024

(51) Int. Cl.

*G06F 11/00* (2006.01)
*G06F 11/14* (2006.01)
*G11C 29/52* (2006.01)

(52) U.S. Cl.

CPC .......... *G06F 11/1417* (2013.01); *G11C 29/52* (2013.01)

(58) Field of Classification Search

CPC ...... G06F 11/2284; G06F 11/24; G06F 11/26; G06F 11/1417; G11C 29/52

See application file for complete search history.

(56) References Cited

U.S. PATENT DOCUMENTS

| | | | |
|---|---|---|---|
| 6,662,285 B1 | 12/2003 | Douglass et al. | |
| 7,382,366 B1 * | 6/2008 | Klock | G06F 11/24 714/E11.154 |
| 7,539,608 B1 | 5/2009 | Dageville et al. | |
| 9,336,115 B1 | 5/2016 | Bienkowski et al. | |
| 10,852,761 B2 * | 12/2020 | Irshad | G06T 1/20 |
| 12,399,621 B2 | 8/2025 | Joshi et al. | |
| 2002/0161609 A1 | 10/2002 | Zizzamia et al. | |
| 2003/0202512 A1 | 10/2003 | Kennedy | |
| 2005/0266711 A1 | 12/2005 | Petersen et al. | |

(Continued)

FOREIGN PATENT DOCUMENTS

WO 2024144868 A1 7/2024

OTHER PUBLICATIONS

Joshi, Jayesh Hari, et al., "US Application as Filed", U.S. Appl. No. 18/147,963, filed Dec. 29, 2022, 55 pages.

(Continued)

*Primary Examiner* — Elmira Mehrmanesh
(74) *Attorney, Agent, or Firm* — FIG. 1 Patents

(57) ABSTRACT

Stability testing for memory overclocking is described. In accordance with the described techniques, operation of a memory with overclocked memory settings is testing during a boot up process of a computing device. Test results based on the testing are exposed via a user interface. The test results predict a stability of the memory over a subsequent time period if the memory is configured to operate with the overclocked memory settings.

20 Claims, 8 Drawing Sheets

(56) References Cited

U.S. PATENT DOCUMENTS

| | | | | |
|---|---|---|---|---|
| 2006/0146638 | A1 | 7/2006 | Chang et al. | |
| 2006/0280018 | A1 | 12/2006 | Cases et al. | |
| 2007/0035985 | A1 | 2/2007 | Fifield et al. | |
| 2007/0044049 | A1 | 2/2007 | Adams et al. | |
| 2007/0183179 | A1 | 8/2007 | Maeda et al. | |
| 2008/0083943 | A1 | 4/2008 | Walker | |
| 2010/0131221 | A1* | 5/2010 | Chien | G11C 29/023 702/81 |
| 2010/0220516 | A1 | 9/2010 | Lee et al. | |
| 2011/0016214 | A1 | 1/2011 | Jackson | |
| 2011/0161706 | A1 | 6/2011 | Huang et al. | |
| 2013/0339592 | A1 | 12/2013 | Yu et al. | |
| 2014/0006864 | A1 | 1/2014 | Menon et al. | |
| 2014/0032826 | A1* | 1/2014 | Lee | G11C 11/4072 711/104 |
| 2014/0229666 | A1 | 8/2014 | Schoenborn et al. | |
| 2014/0317334 | A1 | 10/2014 | Gadsing | |
| 2015/0016191 | A1* | 1/2015 | Tsai | G11C 29/12015 365/185.18 |
| 2015/0270018 | A1 | 9/2015 | Chinnakkonda et al. | |
| 2016/0084919 | A1 | 3/2016 | Gokaraju et al. | |
| 2017/0345510 | A1 | 11/2017 | Achtenberg et al. | |
| 2018/0095806 | A1* | 4/2018 | Aneja | G06F 11/00 |
| 2018/0188769 | A1* | 7/2018 | Chen | G06F 11/24 |
| 2018/0188770 | A1 | 7/2018 | Chen | |
| 2018/0277229 | A1 | 9/2018 | Takizawa et al. | |
| 2020/0097201 | A1 | 3/2020 | Irshad et al. | |
| 2020/0192420 | A1* | 6/2020 | Irshad | G09G 5/39 |
| 2020/0379654 | A1 | 12/2020 | Lin et al. | |
| 2021/0034553 | A1 | 2/2021 | Byron | |
| 2021/0081127 | A1 | 3/2021 | Xiao et al. | |
| 2021/0191450 | A1 | 6/2021 | Mehra et al. | |
| 2021/0200456 | A1* | 7/2021 | Alverson | G11C 29/10 |
| 2021/0208819 | A1 | 7/2021 | Hou et al. | |
| 2021/0241845 | A1 | 8/2021 | Li et al. | |
| 2021/0326232 | A1 | 10/2021 | Partiwala et al. | |
| 2021/0373642 | A1* | 12/2021 | Wang | G06F 9/4411 |
| 2022/0093197 | A1* | 3/2022 | Wu | G06F 13/1689 |
| 2022/0113757 | A1 | 4/2022 | Yan et al. | |
| 2022/0113881 | A1 | 4/2022 | Roberts | |
| 2022/0155982 | A1 | 5/2022 | Alverson et al. | |
| 2022/0179706 | A1 | 6/2022 | Khosrowpour et al. | |
| 2022/0197832 | A1 | 6/2022 | Ruttenberg et al. | |
| 2022/0366994 | A1 | 11/2022 | Zhou et al. | |
| 2023/0107735 | A1 | 4/2023 | Wang et al. | |
| 2023/0215475 | A1 | 7/2023 | Chien et al. | |
| 2023/0350715 | A1 | 11/2023 | Knight et al. | |
| 2023/0409368 | A1 | 12/2023 | Siddiqui | |
| 2024/0220108 | A1 | 7/2024 | Joshi et al. | |

OTHER PUBLICATIONS

Knight, Joshua Taylor, et al., "US Application as Filed", U.S. Appl. No. 18/147,963, filed Dec. 29, 2022, 55 pages.
Leong, Alicia Wen Ju Yurie, et al., "US Application as Filed", U.S. Appl. No. 18/146,538, filed Dec. 27, 2022, 46 pages.
PCT/US2023/036338 , "International Seach Report and Written Opinion", PCT Application No. PCT/US2023/036338, Feb. 20, 2024, 7 pages.
"Non-Final Office Action", U.S. Appl. No. 17/732,987, filed Nov. 22, 2024, 27 pages.
"Final Office Action", U.S. Appl. No. 18/147,963, filed Nov. 12, 2024, 14 pages.
U.S. Appl. No. 18/147,963, filed Jun. 28, 2024 , "Non-Final Office Action", U.S. Appl. No. 18/147,963, filed Jun. 28, 2024, 13 pages.
"Final Office Action", U.S. Appl. No. 17/732,987, filed May 14, 2025, 17 pages.
"Notice of Allowance", U.S. Appl. No. 18/147,963, filed Apr. 25, 2025, 7 pages.
"Supplemental Notice of Allowability", U.S. Appl. No. 18/147,963, filed Jun. 17, 2025, 3 pages.
"Non-Final Office Action", U.S. Appl. No. 17/732,987, Oct. 24, 2025, 27 pages.
"Supplemental Notice of Allowability", U.S. Appl. No. 18/147,963, Aug. 4, 2025, 3 pages.

* cited by examiner

800

802
Test, during a boot up process of a computing device, operation of a memory with overclocked memory settings

804
Expose test results via a user interface, the test results predicting a stability of the memory over a subsequent period of time if the memory is configured to operate with the overclocked memory settings

STABILITY TESTING FOR MEMORY OVERCLOCKING

BACKGROUND

Memory, such as random access memory (RAM), stores data that is used by the processor of a computing device. Performance of a memory generally depends on its operating frequency as well as its latency characteristics, which are often referred to as “timings”. A memory can be “overclocked” by modifying specific parameters of the memory in order to achieve faster operating speeds which improves the performance of the computing device.

DETAILED DESCRIPTION

Overview

Figure 1:
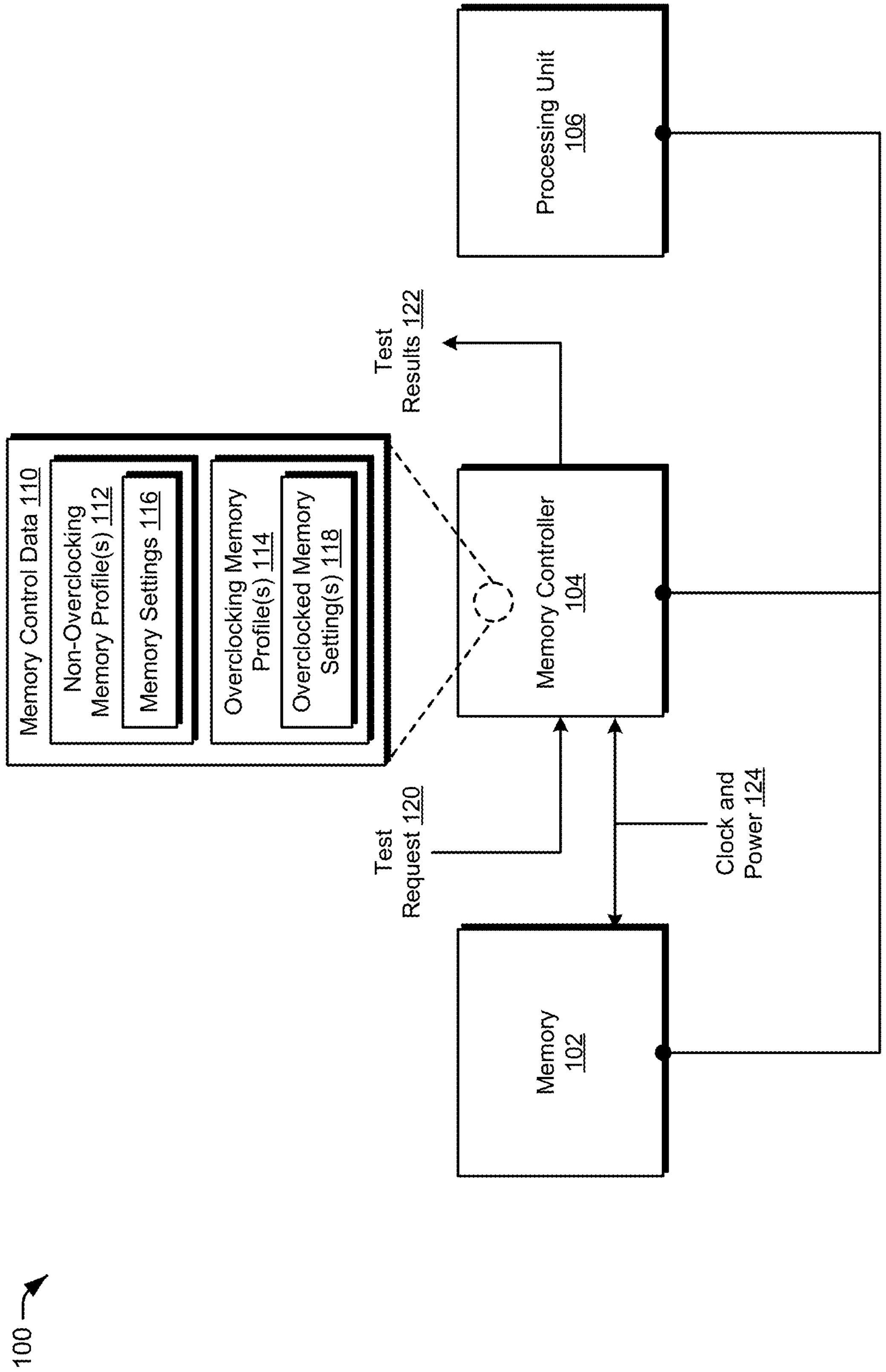
FIG. 1 is a block diagram of a non-limiting example system having a memory and a memory controller operable to implement stability testing for memory overclocking.

Conventional approaches to test a stability of operating a memory with overclocked memory settings involve running one or more “stress tests” using software, such as an operating system. Such tests can take several hours (up to days) to determine a stability of the system. This is at least in part because the conventional tests are performed via software, which involves access (e.g., by an operating system) via one or more cores (of a processing unit), then access via data fabric of the system, and then access to the memory being stress tested. These multiple access points create a slower path than a direct path to memory can provide. Additionally, conventional stress tests are limited to determining the stability of the system for the environmental variables and workload at a time those tests are performed, but the tests do not guarantee that the system will perform stably in the long term, especially if operation of the memory approaches its margins.

To solve these problems, stability testing for memory overclocking is described. In accordance with the described techniques, a memory controller is configured to test a stability of operating a memory with overclocked memory settings during a boot up process of the system. After performing one or more tests on the memory a set of test results indicating a stability of the tested settings are returned. In one or more implementations, human-understandable information indicative of the test results (e.g., one or more scores) is presented (e.g., displayed) via a user interface. Generally, the test results predict a stability of the memory over a subsequent time period to determine if the memory is configured to operate with the tested overclocked memory settings.

Notably, the memory controller is able to directly access the memory during the testing. In other words, the tests are run directly from the memory controller into the memory. As a result, the tests performed on the memory to determine a stability of the overclocked memory settings are faster than conventional stress tests. Moreover, in order to perform one or more of the tests during boot up, the memory controller bypasses refreshes and other periodic activities, which is unable to be performed in various scenarios where the system has already been booted up (e.g., when running software). Additionally, by performing the tests during boot up by directly accessing the memory, the memory controller avoids background latencies that occur with operating systems and/or other software after the system has booted up.

In some aspects, the techniques described herein relate to a system including: a memory, and a memory controller configured to: receive a test request to test overclocked memory settings for the memory, responsive to the test request, initiate a boot up process of the system, during the boot up process of the system, test operation of the memory with the overclocked memory settings, and output test results based on the testing.

In some aspects, the techniques described herein relate to a system, wherein the test results predict a stability of the memory if the memory is configured to operate with the overclocked memory settings.

In some aspects, the techniques described herein relate to a system, wherein the memory controller is configured to test operation of the memory with the overclocked memory settings by performing at least one of reference voltage (Vref) or delay-locked loop (DLL) shmoos.

In some aspects, the techniques described herein relate to a system, wherein the memory controller is configured to test operation of the memory with the overclocked memory settings by generating one or more eye diagrams of the memory.

In some aspects, the techniques described herein relate to a system, wherein the memory controller is configured to output the test results by communicating the test results to an operating system to enable the operating system to display the test results via a user interface.

In some aspects, the techniques described herein relate to a system, wherein the test results include a score indicative of the test results.

In some aspects, the techniques described herein relate to a system, wherein the test results include a graph or chart depicting stability of the memory over time if the memory is configured to operate with the overclocked memory settings.

In some aspects, the techniques described herein relate to a system, wherein the test results include a recommendation to adjust one or more parameters of the overclocked memory settings to improve stability of the memory over a subsequent period of time.

In some aspects, the techniques described herein relate to a method including: testing, during a boot up process of a computing device, operation of a memory with overclocked memory settings, and exposing test results via a user interface, the test results predicting a stability of the memory over a subsequent time period if the memory is configured to operate with the overclocked memory settings.

In some aspects, the techniques described herein relate to a method, wherein the test results include a score indicative of the test results.

In some aspects, the techniques described herein relate to a method, wherein the test results include a graph or chart depicting stability of the memory over time if the memory is configured to operate with the overclocked memory settings.

In some aspects, the techniques described herein relate to a method, wherein the test results include a recommendation to adjust one or more parameters of the overclocked memory settings to improve stability of the memory over the period of time.

In some aspects, the techniques described herein relate to a method, wherein overclocked memory settings are based on user input specifying the overclocked memory settings.

In some aspects, the techniques described herein relate to a method, wherein the testing occurs responsive to receiving a test request to test operation of the memory with the overclocked settings via user input to a user interface.

In some aspects, the techniques described herein relate to a method, wherein the testing includes performing at least one of reference voltage (Vref) or delay-locked loop shmoos.

In some aspects, the techniques described herein relate to a method, wherein the testing includes performing virtual timing and signal an analysis.

In some aspects, the techniques described herein relate to an apparatus including: a memory, and a memory controller configured to: test, during a boot up process of a computing device, operation of a memory with memory settings, and expose test results via a user interface, the test results predicting a stability of the memory over a subsequent time period if the memory is configured to operate with the memory settings.

In some aspects, the techniques described herein relate to an apparatus, wherein the memory settings include overclocked memory settings.

In some aspects, the techniques described herein relate to an apparatus, wherein the overclocked memory settings are specified by a user.

In some aspects, the techniques described herein relate to an apparatus, wherein the memory controller is configured to test operation of the memory with the overclocked memory settings by performing at least one of reference voltage (Vref) or delay-locked loop (DLL) shmoos.

FIG. 1 is a block diagram of a non-limiting example system 100 having a memory and a memory controller operable to implement stability testing for memory overclocking. In particular, the system 100 includes memory 102, memory controller 104, and processing unit 106. In accordance with the described techniques, the memory 102, the memory controller 104, and the processing unit 106 are coupled to one another via one or more wired or wireless connections. Example wired connections include, but are not limited to, buses (e.g., a data bus), interconnects, through silicon vias, traces, and planes. Examples of a device or apparatus in which the system 100 is configured for integration include, but are not limited to, servers, personal computers, laptops, desktops, game consoles, set top boxes, tablets, smartphones, mobile devices, virtual and/or augmented reality devices, wearables, medical devices, systems on chips, and other computing devices or systems.

The memory 102 is a device or system that is used to store information, such as for immediate use in a device. In one or more implementations, the memory 102 corresponds to semiconductor memory where data is stored within memory cells on one or more integrated circuits. In at least one example, the memory 102 corresponds to or includes volatile memory, examples of which include random-access memory (RAM), dynamic random-access memory (DRAM), and static random-access memory (SRAM). Alternatively or in addition, the memory 102 corresponds to or includes non-volatile memory, examples of which include flash memory, read-only memory (ROM), programmable read-only memory (PROM), erasable programmable read-only memory (EPROM), electronically erasable programmable read-only memory (EEPROM), and non-volatile memory (NVDIMM).

In one or more implementations, the memory 102 is configured as a dual in-line memory module (DIMM). A DIMM includes a series of dynamic random-access memory integrated circuits, and the modules are mounted on a printed circuit board. Examples of types of DIMMs include, but are not limited to, synchronous dynamic random-access memory (SDRAM), double data rate (DDR) SDRAM, double data rate 2 (DDR2) SDRAM, double data rate 3 (DDR3) SDRAM, double data rate 4 (DDR4) SDRAM, and double data rate 5 (DDR5) SDRAM. In at least one variation, the memory 102 is configured as a small outline DIMM (SO-DIMM) according to one of the above-mentioned SDRAM standards, e.g., DDR, DDR2, DDR3, DDR4, and DDR5. In one or more implementations, the memory 102 is low-power double data rate (LPDDR), also known as LPDDR SDRAM, and is a type of synchronous dynamic random-access memory. In variations, LPDDR consumes less power than other types of memory and/or has a form factor suitable for mobile computers and devices, such as mobile phones. Examples of LPDDR include, but are not limited to, low-power double data rate 2 (LPDDR2), low-power double data rate 3 (LPDDR3), low-power double data rate 4 (LPDDR4), and low-power double data rate 5 (LPDDR5). It is to be appreciated that the memory 102 is configurable in a variety of ways without departing from the spirit or scope of the described techniques.

The memory controller 104 manages the memory 102, including the communication of data to and from the memory 102. For example, the memory controller 104 manages the communication of data to the memory 102 from the processing unit 106 and the communication of data from the memory 102 to the processing unit 106, e.g., over a coupling between the memory 102 and the processing unit 106. As discussed above and below, the memory controller 104 also tests (e.g., during a boot up process) stability of settings (e.g., clock and/or power settings) according to which the memory 102 is or can be configured to operate. In at least one variation, such settings are specified in one or more memory profiles.

The processing unit 106 is a component that requests access to data from the memory 102 for performing one or more operations in relation to such data, e.g., in connection with executing an application (not shown). Examples of the processing unit include, but are not limited to, a central processing unit, a parallel accelerated processor (e.g., a graphics processing unit), a digital signal processor, a hardware accelerator, a microcontroller, and a system on chip. In variations, different types of processing units are useable in the system in accordance with the described techniques.

In the illustrated example, the memory controller 104 is depicted having memory control data 110, which in this example includes one or more non-overclocking memory profiles 112 and one or more overclocking memory profiles 114. The non-overclocking memory profiles 112 are implemented using memory settings 116 whereas the overclocking memory profiles 114 are implemented using overclocked memory settings 118.

In accordance with the described techniques, the overclocked memory settings 116 include at least one memory setting that is overclocked. In one or more scenarios, not all memory settings of an overclocking memory profile 114 are overclocked. In other scenarios, however, all the memory settings of an overclocking memory profile 114 may be overclocked. In one or more implementations, a memory setting that is "overclocked" exceeds a certified value of the setting, e.g., a clock rate set to exceed the clock rate certified by a manufacturer of the memory 102 is "overclocked." By contrast, a memory setting that is not "overclocked" does not exceed the certified value of the setting, e.g., a clock rate that is not "overclocked" does not exceed the clock rate certified by a manufacturer of the memory 102. Broadly, use of overclocked memory setting(s) 118 and/or use of an overclocking memory profile 114 enables the memory 102 to operate in an overclocking mode.

In accordance with the described techniques, the memory controller 104 and/or another component of the system 100 (e.g., physical layer (PHY)) is configured to test stability of memory settings for operating the memory 102, such as testing a stability of the memory settings 116 of one or more non-overclocking memory profiles 112 and/or the overclocked memory settings 118 of one or more overclocking memory profiles 114. In at least one variation, the memory controller 104 tests a stability of a set of the overclocked memory settings 118 for operating the memory 102 (e.g., an overclocking memory profile 114) during a boot up process of the system 100. For example, user input specifying one or more settings of a set of overclocked memory settings 118 is received and further user input selecting to test the specified settings is then received. In accordance with the described techniques, such user input initiates a test request 120 which requests to test the stability of one or more memory settings. In the continuing example, a boot up process of the system 100 is subsequently performed, during which the memory controller 104 tests the stability of the overclocked memory settings 118 specified via the user input. After performing one or more tests on the memory 102, test results 122 indicating a stability of the tested settings are returned. In one or more implementations, human-understandable information indicative of the test results 122 (e.g., one or more scores) is presented (e.g., displayed) via a user interface as discussed in more detail below. Generally, the test results predict a stability of the memory over a subsequent time period if the memory is configured to operate with the set of overclocked memory settings.

In one or more implementations, the memory controller 104 is also configured to test a stability of at least one set of the memory settings 116 for operating the memory 102 (e.g., a non-overclocking memory profile 112) along with testing one or more sets of the overclocked memory settings 118. For example, stabilities of settings are tested for both the overclocking memory profiles 114 and the non-overclocking memory profiles 112 during the boot up process of the system 100. Alternatively or in addition, the memory controller 104 is configured to test stability of the settings for operating the memory 102 during a different phase, such as while the system 100 is in a "sleeping" state.

In one or more implementations, the memory controller 104 and/or another component of the system 100 (e.g., physical layer (PHY)) perform one or more tests of the memory 102 during a boot up phase—it is to be appreciated that the tests described above and below are performable by the memory controller 104 and/or another component in variations, even if described herein as being performed by the memory controller 104. The performed tests are configured to test a stability of at least one set of memory settings (e.g., of an overclocking memory profile 114), such as a stability of the memory 102 to operate using the at least one set of memory settings. By way of example, during training of the memory 102, the memory controller 104 determines stable margins for bitlines of the memory 102 to operate and uses those margins to determine optimal settings for initializing the hardware. In accordance with the described techniques, the memory controller 104 also uses the stable margins to determine stability of the memory 102 for a subsequent period of time, e.g., hardware stability in the long term.

Examples of the one or more tests the memory controller 104 and/or other component perform on the memory 102 during boot up to test the stability of the memory 102 under various settings include, but are not limited to, performing reference voltage (Vref) and/or delay-locked loop (DLL) shmoos (e.g., to generate one or more "eye diagrams" of the memory 102 or portions of the memory 102), performing virtual timing and signal analysis (vTSA), adjusting different voltage and/or delay levels to generate visualization of memory data eyes for different bits of the memory, checking one or more portions of the memory 102 for rowhammering, and performing one or more RSC tests. In one or more implementations, the memory controller 104 generates one or more eye diagrams of the memory 102 using a combination (e.g., a multidimensional combination) of reference voltage (Vref) and DLL shmoos. In at least one variation, the reference voltage (Vref) is shmooed to determine if the signal is a '1' or a '0' in connection with creating the memory eye diagrams. Based on the generated eye diagrams, for instance, the memory controller 104 obtains the margins at which the memory 102 is capable of performing given variations in the environment in which the memory 102 operates. In variations, different tests are performed to test the stability of the memory 102 without departing from the described techniques.

By way of contrast to the described techniques, conventional approaches involve running one or more "stress tests" using software, such as via an operating system. Such tests can take several hours (up to days) to determine a stability of the system. This is at least in part because the conventional tests are performed via software, which involves access (e.g., by an operating system) via one or more cores (of a processing unit), then access via data fabric of the system, and then access to the memory being stress tested—a slower path than a direct path to memory. Additionally, conventional stress tests are limited to determining the stability of the system for the environmental variables and workload at a time those tests are performed, but the tests do not guarantee that the system will perform stably in the long term, especially if operation of the memory approaches its margins.

In accordance with the described techniques, the memory controller 104 accesses the memory 102 directly. In other words, the tests are run from the memory controller 104 directly into the memory 102. As a result, the tests performed on the memory 102 to determine a stability of the overclocked memory settings 118 are faster than conventional stress tests. In order to perform one or more of the tests during boot up, the memory controller 104 bypasses refreshes and other periodic background activities, which is unable to be performed in various scenarios where the system has already been booted up (e.g., when running software). Additionally, by performing the tests during boot up by directly accessing the memory 102, the memory controller 104 avoids background latencies that occur with operating systems and/or other software after the system has booted up. During boot up, the memory controller 104 tests a stability of various combinations of settings (e.g., overclocked memory settings 118) for operating the memory 102 without departing from the spirit or scope of the described techniques.

In one or more implementations, the memory settings 116 and the overclocked memory settings 118 include various clock and/or power settings. Example settings include, but are not limited to, a data rate (e.g., megatransfers per second), a number of cycles between sending a column address to memory and the beginning of data in a response (e.g., CAS or tCAS), a minimum number of clock cycles to open a row and access a column (e.g., tRCD), a measure of latency between issuing a precharge command to idle or close open row and an activate command to open a different row (e.g., tRP), a minimum number of clock cycles between a row active command and issuing a precharge command (e.g., tRAS), nominal power supply voltage (e.g., VDD), output stage drain power voltage (e.g., VDDQ), and programming power voltage (e.g., VPP). It is to be appreciated that the memory settings 116 and/or the overclocked memory settings 118 specify values for one or more of those settings and/or various other settings associated with operating memory without departing from the spirit or scope of the described techniques.

The illustrated example also depicts clock and power 124 inputs to the memory 102 and the memory controller 104. In accordance with the described techniques, the memory controller 104 and/or another component is configured to set the clock and power 124 inputs to cause the memory 102 to operate according to a set of memory settings, such as a memory profile. For instance, the clock and power 124 inputs cause the memory 102 to operate according to one of the non-overclocking memory profiles 112 implemented using a set of the memory settings 116 or one of the overclocking memory profiles 114 implemented using a set of the overclocked memory settings 118.

For example, the memory controller 104 causes the memory 102 to operate according to a set of the memory settings 116 or a set of the overclocked memory settings 118 by sending one or more change signals to a voltage generator (not shown) to adjust a supply voltage (e.g., VDD), such that the clock and power 124 inputs subsequently include the supply voltage as adjusted according to the change signals. Additionally or alternatively, the memory controller 104 sends a change signal to a reference clock generator (not shown) to change a frequency of a clock rate, such that the clock and power 124 inputs subsequently include a reference clock signal as adjusted according to the change signals. The memory controller 104 is operable to adjust the clock and power 124 inputs in various ways to produce the settings specified, e.g., in a given memory profile, for operating the memory 102.

Figure 2:
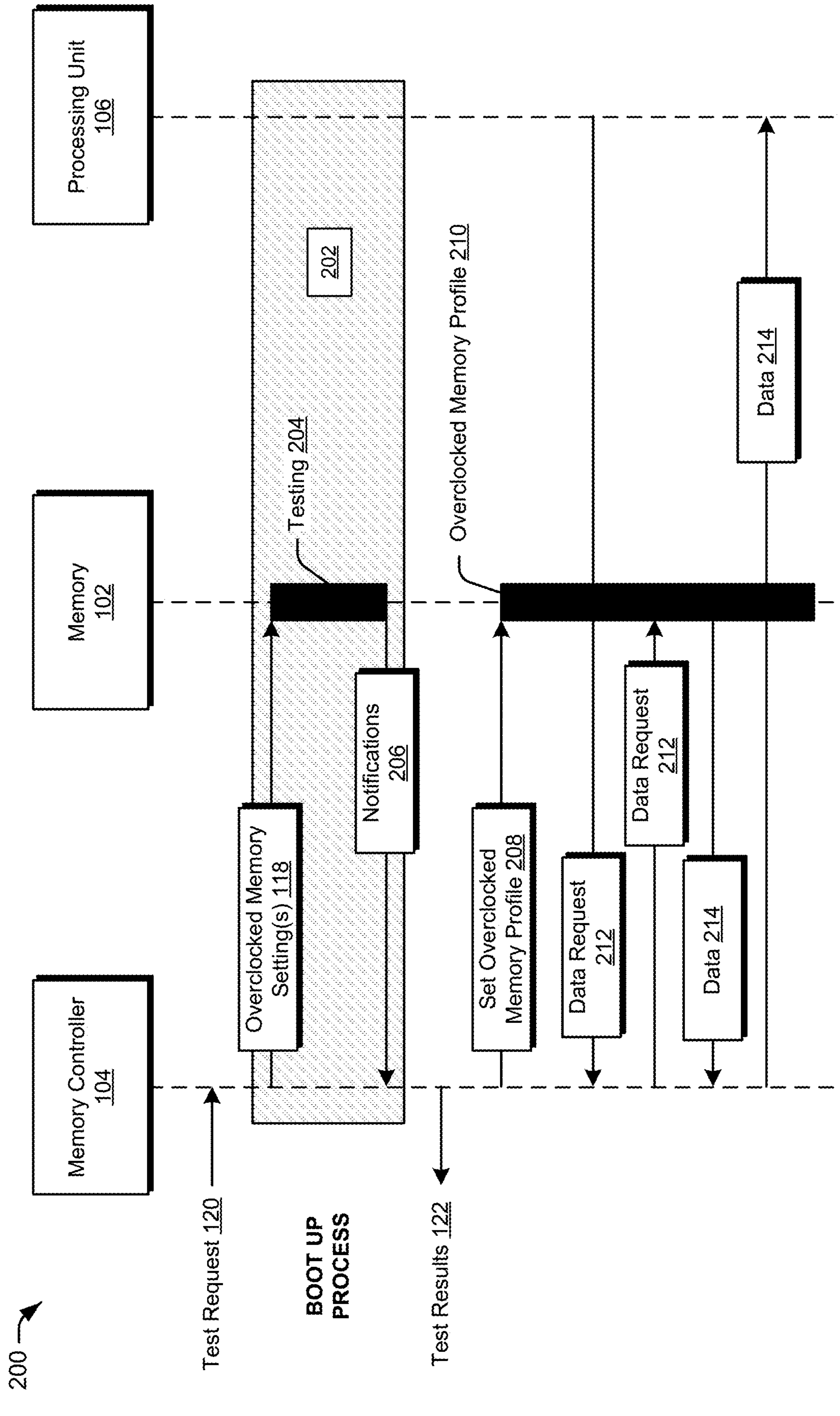
FIG. 2 depicts a non-limiting example in which stability of overclocked memory settings is tested and test results are output.

FIG. 2 depicts a non-limiting example 200 in which stability of overclocked memory settings is tested and test results are output. The example 200 includes from FIG. 1 the memory 102, the memory controller 104, and the processing unit 106.

The example 200 includes a variety of example communications and operations between the memory controller 104, the memory 102, and the processing unit 106 over time. In this example 200, the communications and operations are positioned vertically based on time, such that communications and operations closer to a top of the example occur prior to communications or operations further from the top of the example. It follows also that communications or operations closer to a bottom of the example occur subsequent to communications or operations further from the bottom. The example 200 also depicts various phases and/or states of the system 100 or portions of the system 100. These phases and/or states are also positioned in the example 200 vertically based on time, such that phases or states closer to a top of the example occur prior to phases, states, or communications further from the top.

Here, the illustrated example 200 depicts the memory controller 104 receiving the test request 120. In one or more implementations, the test request 120 is received based on user input, such as user input received via a displayed control to test a set of memory settings. For instance, user input is received via a displayed control to test one or more sets of the overclocked memory settings 118 (e.g., of one or more overclocking memory profiles 114) and/or one or more sets of the memory settings 116 (e.g., of one or more non-overclocking memory profiles 112). The illustrated example 200 also depicts a boot up phase 202 of the system 100. In one or more implementations, the system 100 enters the boot up phase 202 based on receipt of the test request 120. Although a powered off phase is not depicted, in one or more such implementations, the system 100 is powered off based on the test request 120, and then the system 100 is triggered to boot up. During a powered off phase, the system 100 (and the memory 102) is powered off, examples of which include a soft off (e.g., G2/S5 state as specified by Advanced Configuration and Power Interface (ACPI)) and a mechanical off (e.g., G3 state as specified by ACPI), which require a reboot to return to a working state (e.g., G0/S0 state as specified by ACPI). During the boot up phase 202, the system 100 performs various operations, such as hardware initializations, to advance the system 100 to a working state.

In accordance with the described techniques, the boot up phase 202 includes testing 204 of the memory 102. In one or more implementations, for instance, the memory controller 104 tests a stability of overclocked memory settings 118 for operating the memory 102. As part of the testing 204, in one or more implementations, the memory controller 104 tests a stability of operating the memory 102 with the overclocked memory settings 118 by performing reference voltage (Vref) and/or delay-locked loop (DLL) shmoos and/or by generating one or more "eye diagrams" of the memory 102 or portions of the memory 102. Based on the testing 204, for instance, the memory controller 104 obtains the margins at which the memory 102 is capable of performing.

As the memory controller 104 performs the testing 204 on the memory 102, the memory controller 104 receives notifications 206 (e.g., signals), which indicate a response of the memory 102 to the tests performed during the boot up phase 202. For instance, as the memory controller 104 performs reference voltage (Vref) and/or DLL shmoos in the memory 102, the memory controller 104 receives notifications 206 indicative of operation of the memory 102 and/or margins of its operation, under various combinations of voltage and/or delay levels. In one or more implementations, the memory controller 104 determines the test results 122 based on the notifications 206 (e.g., signals) received from the memory 102 during the testing 204. Broadly, the test results 122 indicate a stability of the overclocked memory settings 118, e.g., a set of the overclocked memory settings 118.

Subsequent to the testing 204, the memory controller 104 outputs the test results 122. In one or more implementations, the memory controller 104 outputs the test results 122 by communicating them to software (e.g., via a handshake), such as to an operating system (not shown). Alternatively or additionally, an operating system further provides the test results to an application running on the operating system, such as to a memory management application. In accordance with the described techniques, the test results 122 are output (e.g., displayed) in a human-understandable format via a user interface, such as via a user interface of an operating system and/or a user interface of a memory management application.

Examples of formats in which the test results 122 are output include, but are not limited to, numerical scores, stop-light icons (e.g., green indicating stable, red indicating not stable, yellow indicating that some adverse outcomes may be experienced), text labels describing hierarchical levels of stability, graphical icons, graphs or charts depicting a stability of the memory over time if the memory is configured to operate with the overclocked memory settings, and one or more visualizations of generated eye diagrams, to name just a few. In variations, the test results 122 are output in different human-understandable ways indicative of stability of the memory 102 under tested settings without departing from the spirit or scope of the described techniques. Additionally or alternatively, during the testing 204, the memory controller 104 tests a stability of one or more non-overclocking memory profiles 112 for operating the memory 102.

Additionally or alternatively, the test results 122 can include or be used to generate a recommendation for output. In one variation, for instance, such a recommendation recommends that a user re-run the tests (e.g., the stability tests) on the memory 102, such as if the environment in which the system 100 operates changes drastically outside predicted margins either in time or based on one or more other factors. By way of example, a software application (e.g., a memory management application) creates and causes output (e.g., display) of a notification after a threshold amount of time (e.g., a number of hours, days, months, etc.) reminding a user of the system 100 to re-run the stability tests. In one or more implementations, the memory controller 104 and/or software determines to output such a recommendation (e.g., to re-run the stability test) using predicted stability margins, e.g., based on the voltage, temperature, and/or environment of the system 100 (or some portion of the system 100).

Also in this example 200, the memory controller 104 provides one or more set overclocked memory profile 208 signals to the memory 102 to cause the memory 102 to operate according to an overclocked memory profile 210, such as a memory profile having settings that the test results 122 indicate are relatively stable. In accordance with the described techniques, the memory controller 104 causes the memory 102 to operate according to the overclocked memory profile 210, such as subsequent to having operated according to a different memory profile (e.g., a non-overclocking memory profile 112 or a different overclocking memory profile 114).

The memory 102 is also depicted receiving data requests 212 originating from the processing unit 106 and providing data 214 to the processing unit 106 for servicing those requests, in accordance with the described techniques. In particular, the memory controller 104 receives one or more data requests 212 from the processing unit 106 and the memory controller 104 schedules the data request 212 to the memory 102. The memory controller 104 then accesses (e.g., reads) a portion of the memory 102 corresponding to the data request 212 (e.g., to retrieve respective data 214). The memory controller 104 then provides the respective data 214 to the processing unit 106. This process of requesting data, retrieving data from the memory 102 (e.g., reading the data from the memory 102), and providing the data read back to the processing unit 106 is performed while the memory operates according to the overclocked memory profile 210.

In the context of displaying information about stability of memory settings for operating memory, tested directly by a memory controller during a boot up process, consider the following discussion of FIGS. 3-7.

Figure 3:
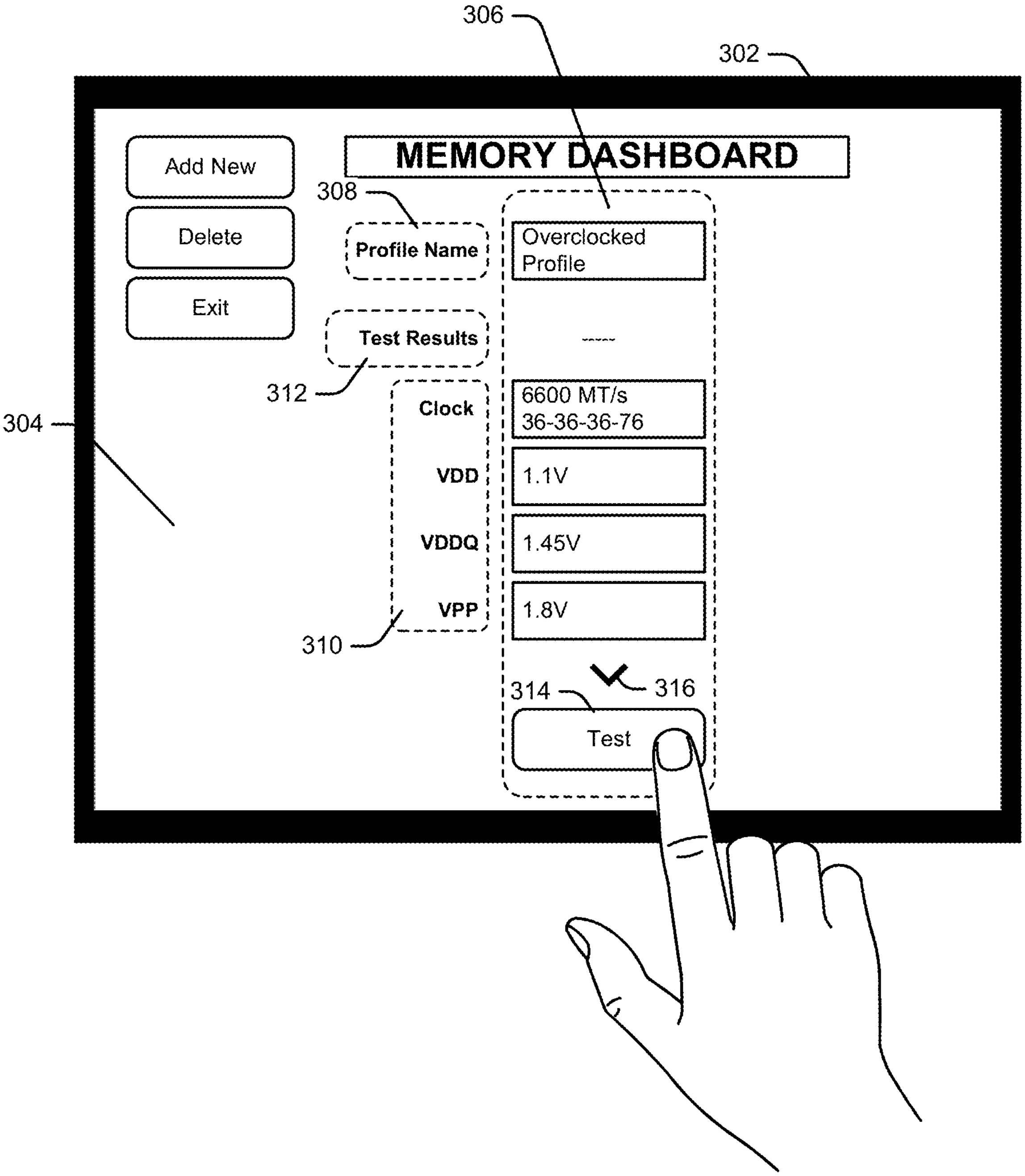
FIG. 3 depicts a non-limiting example of a user interface in one or more implementations.

FIG. 3 depicts a non-limiting example 300 of a user interface in one or more implementations. The example 300 includes a display device 302 outputting a memory overclocking user interface 304.

In the illustrated example 300, the user interface 304 is depicted displaying a memory profile 306 according to which the memory 102 is operable. In this example 300, the memory profile 306 is an overclocking memory profile 114, implemented using one or more overclocked memory settings 118. In this example 300, the memory profile 306 is indicated being an overclocking memory profile 114 due to the name "Overclocked Profile". In variations, however, memory profiles are indicated as being overclocking memory profiles 114 (as opposed to non-overclocking memory profiles 112) in different ways. This is because in some variations, memory profile names do not clearly indicate that respective profiles are overclocked, e.g., "gaming profile," "production profile," "low-latency profile," and so on. In one or more implementations, memory profiles that are overclocking memory profiles are distinguished (e.g., visually) from non-overclocking memory profiles in various ways.

In this example 300, the memory profile 306 includes a profile name 308 (or identifier), a plurality of settings 310 according to which the memory 102 is operated when the respective profile controls operation of the memory 102, and an indication 312 of the test results 122 produced for the plurality of settings 310. Here, the indication 312 of the test results 122 represents that the plurality of settings 310 have not yet been tested and/or have not been tested within a threshold amount of time. In one or more implementations, the fact that a stability of settings for operating the memory 102 has not yet been tested or has not been tested within a threshold amount of time is indicated in a different way without departing from the spirit or scope of the described techniques.

In accordance with the described techniques, the user interface 304 also includes a control 314 (e.g., a displayed control) that is selectable to initiate testing of the settings of the memory profile 306. For instance, receipt of user input in relation to the control 314 corresponds to or triggers the test request 120, which causes the system 100 to test a stability of the plurality of settings 310 of the memory profile 306 (e.g., a set of overclocked memory settings 118) for operating the memory 102. This includes performing the testing 204 of the plurality of settings 310 directly in the memory 102 by the memory controller 104 during the boot up phase 202.

In this example 300, the memory profile 306 is illustrated including a scroll element 316. The scroll element 316 represents that the memory profile 306 includes values for more settings than those depicted, in at least one variation. As noted above, memory profiles are configured to specify different settings for operating the memory 102 (e.g., in an overclocking mode) in various implementations. In one or more implementations, the user interface 304 is further configured to receive user input to modify one or more of the settings. For instance, the user interface 304 receives user input to modify clock settings, frequency settings, and/or voltage settings of the memory profile 306. In at least one such implementation, responsive to such modification the indication 312 indicates that a stability of the modified settings has not yet been tested on the memory 102.

In one or more implementations, the user interface 304 includes at least one interface element (e.g., "Add New" button) that enables a user to add a new memory profile to the memory control data 110 (e.g., a new non-overclocking memory profiles 112 and/or a new overclocking memory profile 114), such that the new memory profile includes one or more user-specified settings.

Figure 4:
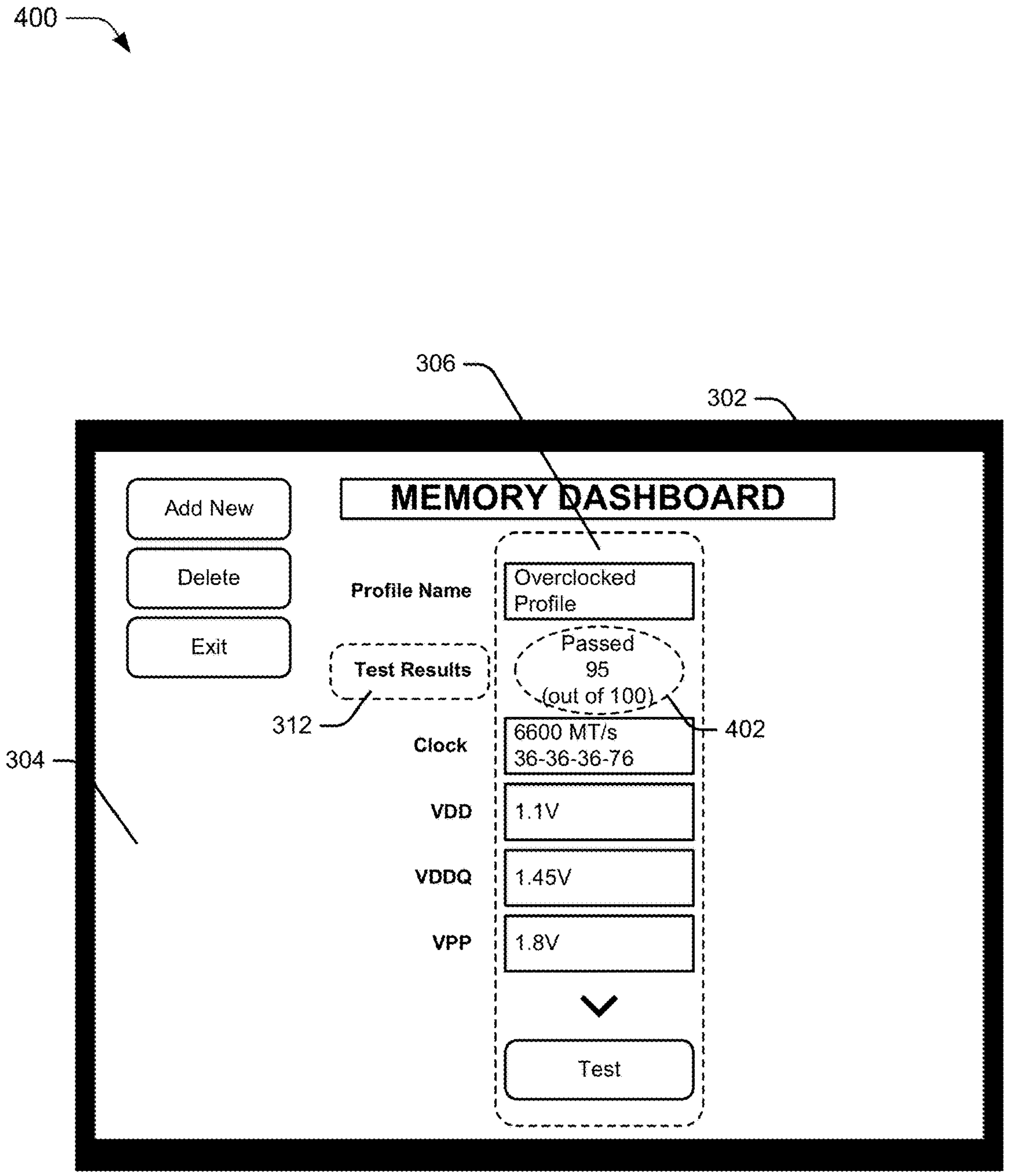
FIG. 4 depicts another non-limiting example of the user interface in one or more implementations.

FIG. 4 depicts another non-limiting example 400 of the user interface in one or more implementations. The example 400 includes the display device 302 displaying the user interface 304, which includes the memory profile 306.

In contrast to the example depicted in FIG. 3, in this example 400, the indication 312 of the test results 122 indicates that a stability of the plurality of settings 310 for operating the memory 102 has been tested. In this example 400, for instance, the indication 312 includes human-understandable information 402 indicative of, or otherwise corresponding to, the test results 122. Here, the human-understandable information 402 includes a stability score (e.g., '95') and a text label (e.g., 'Passed') indicative of the test results 122. Although both a stability score and a text label are depicted in the illustrated example 400, in variations, the indication 312 includes either a stability score or a text label indicative of the test results 122. In variations, the indication 312 of the test results 122 includes different and/or additional human-understandable information indicative of the test results 122 without departing from the spirit or scope of the described techniques.

Figure 5:
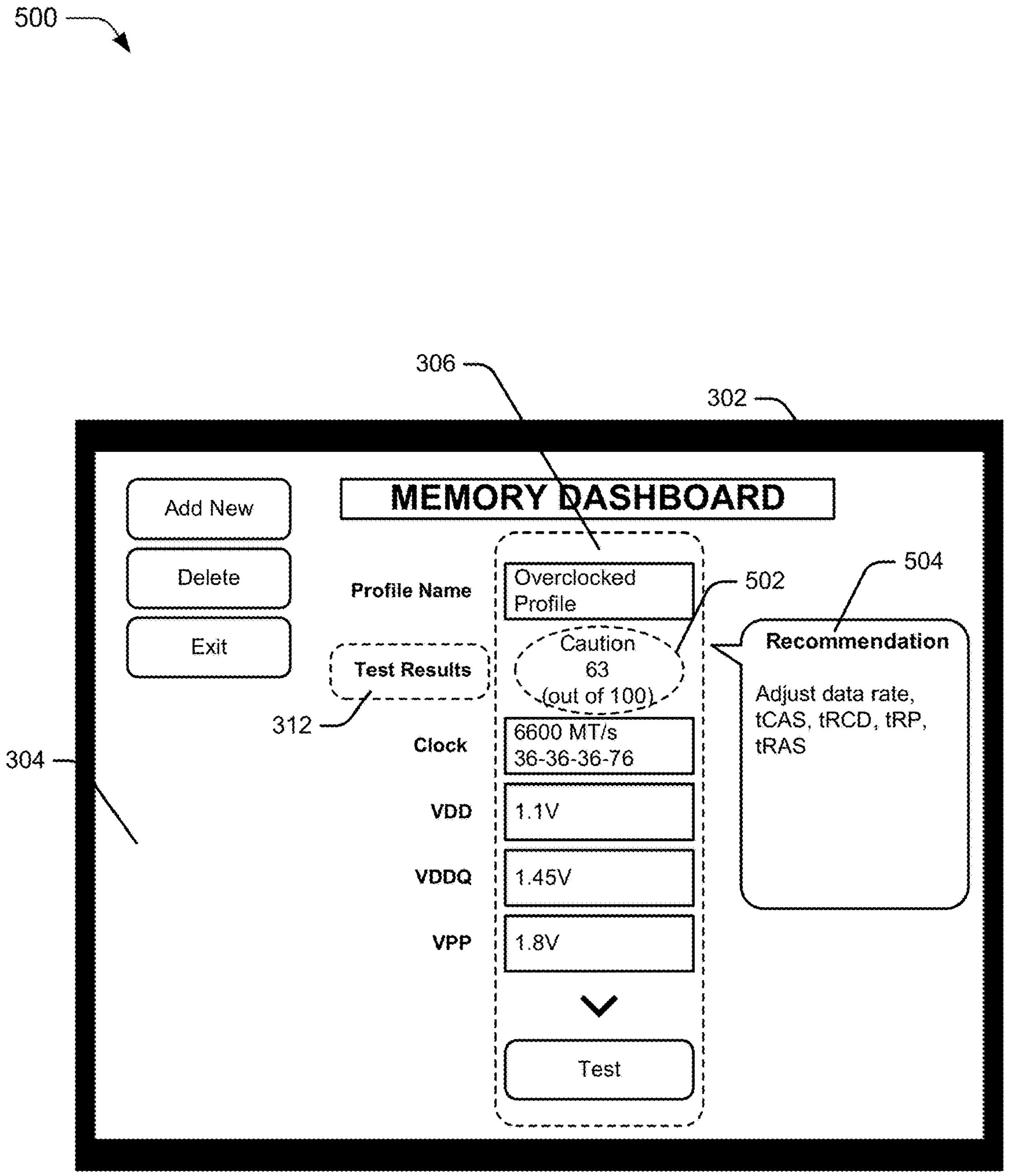
FIG. 5 depicts another non-limiting example of the user interface in one or more implementations.

FIG. 5 depicts another non-limiting example 500 of the user interface in one or more implementations. The example 500 includes the display device 302 displaying the user interface 304, which includes the memory profile 306.

In this example 500, the indication 312 of the test results 122 again indicates that a stability of the plurality of settings 310 for operating the memory 102 has been tested. In contrast to the example depicted in FIG. 4, however, the indication 312 includes different human-understandable information 402 indicative of the test results 122. In operation, this occurs due to testing a different set of settings, such as a more aggressive set of overclocked memory settings 118. Here, the human-understandable information 502 again includes a stability score and a text label indicative of the test results 122. However, the stability score and the text label in this example 500 are different from the human-understandable information 402 in the example 400. In this example 500, the human-understandable information 502 includes a stability score of '63' and the text label 'Caution' indicative of the test results 122. As noted above, the indication 312 of the test results 122 includes different and/or additional human-understandable information indicative of the test results 122 without departing from the spirit or scope of the described techniques.

In this example 500, the user interface 304 is also depicted displaying a recommendation 504. In one or more implementations, the recommendation 504 includes one or more recommendations for adjusting a set of settings that were tested. For example, the recommendation 504 may include a recommendation to adjust one or more parameters of the overclocked memory settings to improve stability of the memory over the subsequent time period. The one or more recommendations included in the recommendation 504 are determined based on the test results 122, for instance, and based on the combination of settings tested during the boot up phase 202. In at least one variation, for instance, the recommendation 504 is output based on a score satisfying or failing to satisfy one or more thresholds, e.g., the score is less than a stability threshold which corresponds to a suitable stability. Although the recommendation 504 is displayed in the illustrated example 500, in variations, the recommendation 504 is output in other ways, e.g., audibly.

Figure 6:
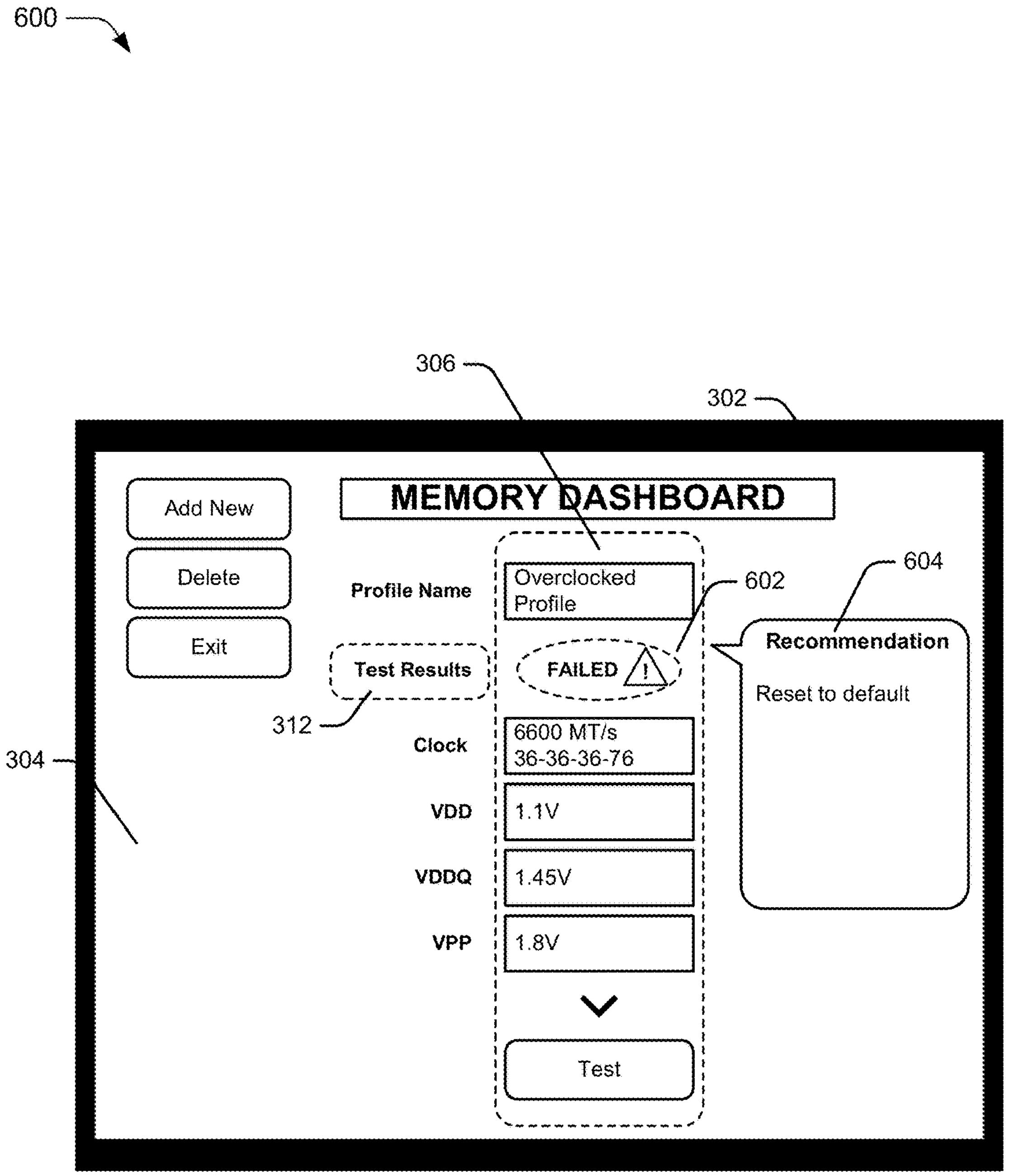
FIG. 6 depicts another non-limiting example of the user interface in one or more implementations.

FIG. 6 depicts another non-limiting example 600 of the user interface in one or more implementations. The example 600 includes the display device 302 displaying the user interface 304, which includes the memory profile 306.

In this example 600, the indication 312 of the test results 122 again indicates that a stability of the plurality of settings 310 for operating the memory 102 has been tested. The indication 312 includes different human-understandable information 602 indicative of the test results 122 from the previously discussed examples. Here, the human-understandable information 602 indicates that the tested settings have "failed" the testing 204, such that operation of the memory 102 according to the tested settings is not suitably stable to satisfy some stability threshold. Here, the human-understandable information 602 includes a text label and a graphical icon indicative of the test results 122. In this example 600, the human-understandable information 602 includes the text label 'FAILED' and graphical icon (e.g., a warning icon) indicative of the test results 122. As noted above, the indication 312 of the test results 122 can include different and/or additional human-understandable information indicative of the test results 122 without departing from the spirit or scope of the described techniques.

In this example 600, the user interface 304 is again depicted displaying a recommendation 604. As noted above, the recommendation 504 includes one or more recommendations for adjusting a set of settings that were tested. Here, for example, the recommendation 604 recommends resetting the settings to a default configuration. In accordance with the described techniques, the one or more recommendations included in a recommendation 604 are determined based on the test results 122 and based on the combination of settings tested during the boot up phase 202 to produce those results. In at least one variation, for instance, the recommendation 604 is output based on a score satisfying or failing to satisfy one or more thresholds, e.g., the score is less than a stability threshold which corresponds to a predetermined stability. Although recommendations are depicted in FIGS. 5 and 6, in one or more implementations, recommendations are not output, even when a stability of the tested settings is less than one or more threshold stabilities.

Figure 7:
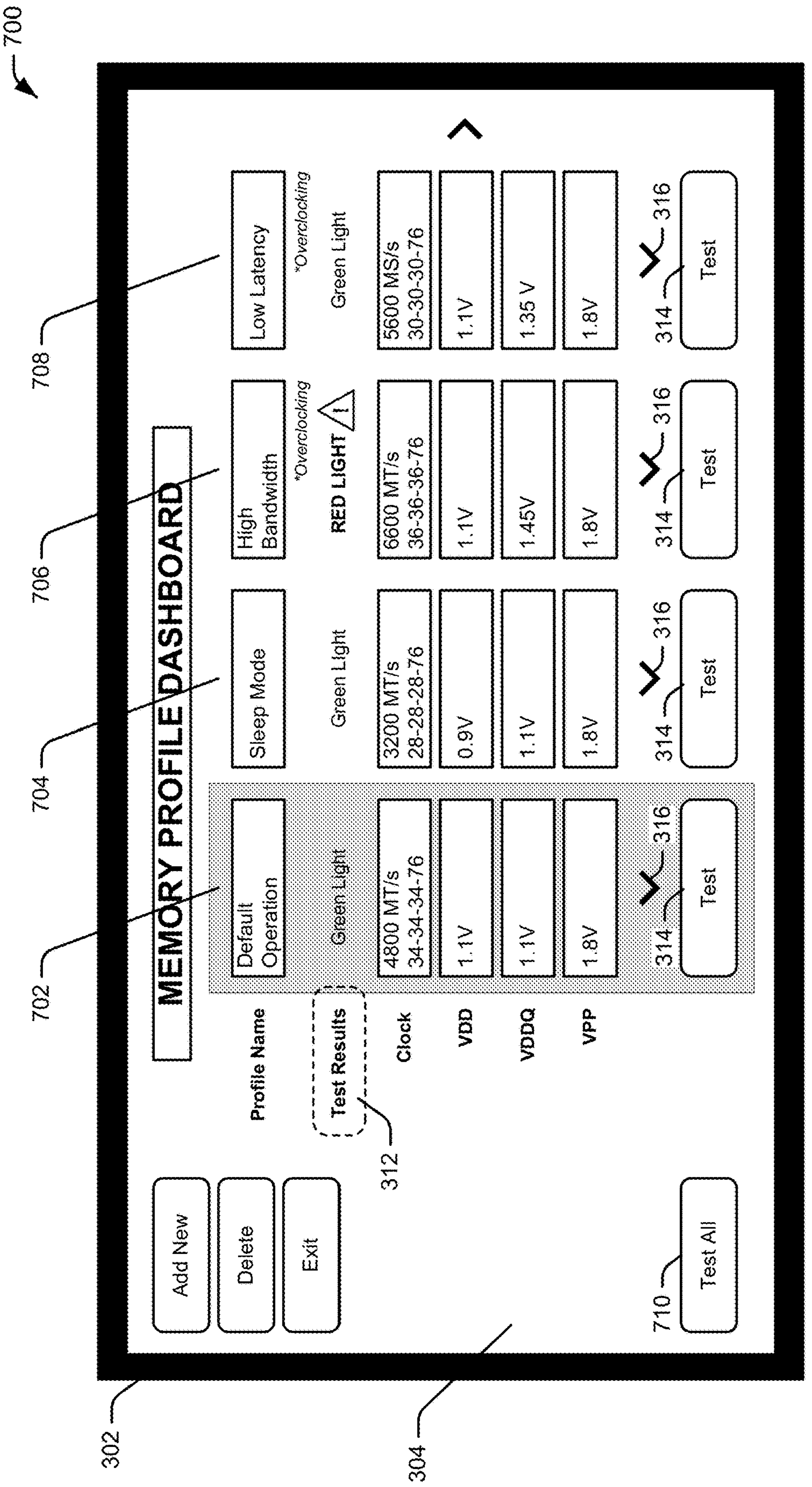
FIG. 7 depicts another non-limiting example of the user interface in one or more implementations.

FIG. 7 depicts another non-limiting example 700 of the user interface in one or more implementations. The example 700 includes the display device 302 displaying the user interface 304, which includes a plurality of memory profiles 702-708.

In this example 700, each of the memory profiles 702-708 has a respective set of settings. For example, the memory profiles 702, 704 correspond to non-overclocking memory profiles 112 having memory settings 116 and the memory profiles 706, 708 correspond to overclocking memory profile 114 having overclocked memory settings 118, as indicated by the "*Overclocking" indication.

In addition, the example 700 depicts that the indication 312 of the test results 122 for each profile includes human-understandable information which indicates that the respective settings of each profile have been tested, e.g., during the testing 204 while in the boot up phase 202. The human-understandable information in the example 700 is formatted in different ways (e.g., stoplight-like) which are indicative of the test results 122. Each of the memory profiles 702-708 is also depicted with a control 314 (e.g., a displayed control) that is selectable to initiate testing of the settings of the respective memory profile 702-708. In this way, the testing 204 can test a stability of settings of a single memory profile during the boot up phase 202. The illustrated example also includes a global test control 710, which is selectable to initiate testing of the settings of all the memory profiles 702-710. In such a scenario, the testing 204 tests stability of the settings of each profile during the boot up phase 202, such that test results 122 for each set of the settings (e.g., for each of the memory profiles 702-708) are provided to the operating system and/or an application (e.g., a memory management application). In one or more implementations, the user interface 304 also includes the ability for a user to select to test settings for more than one memory profile and less than all of them. Indeed, user interfaces are configurable in a variety of ways to allow a user to initiate testing of memory settings during the boot up phase 202 of the system 100 and to subsequently present the test results 122 as human-understandable information without departing from the spirit or scope of the described techniques.

Having discussed example systems and user interfaces for stability testing for memory overclocking, consider the following example procedures.

Figure 8:
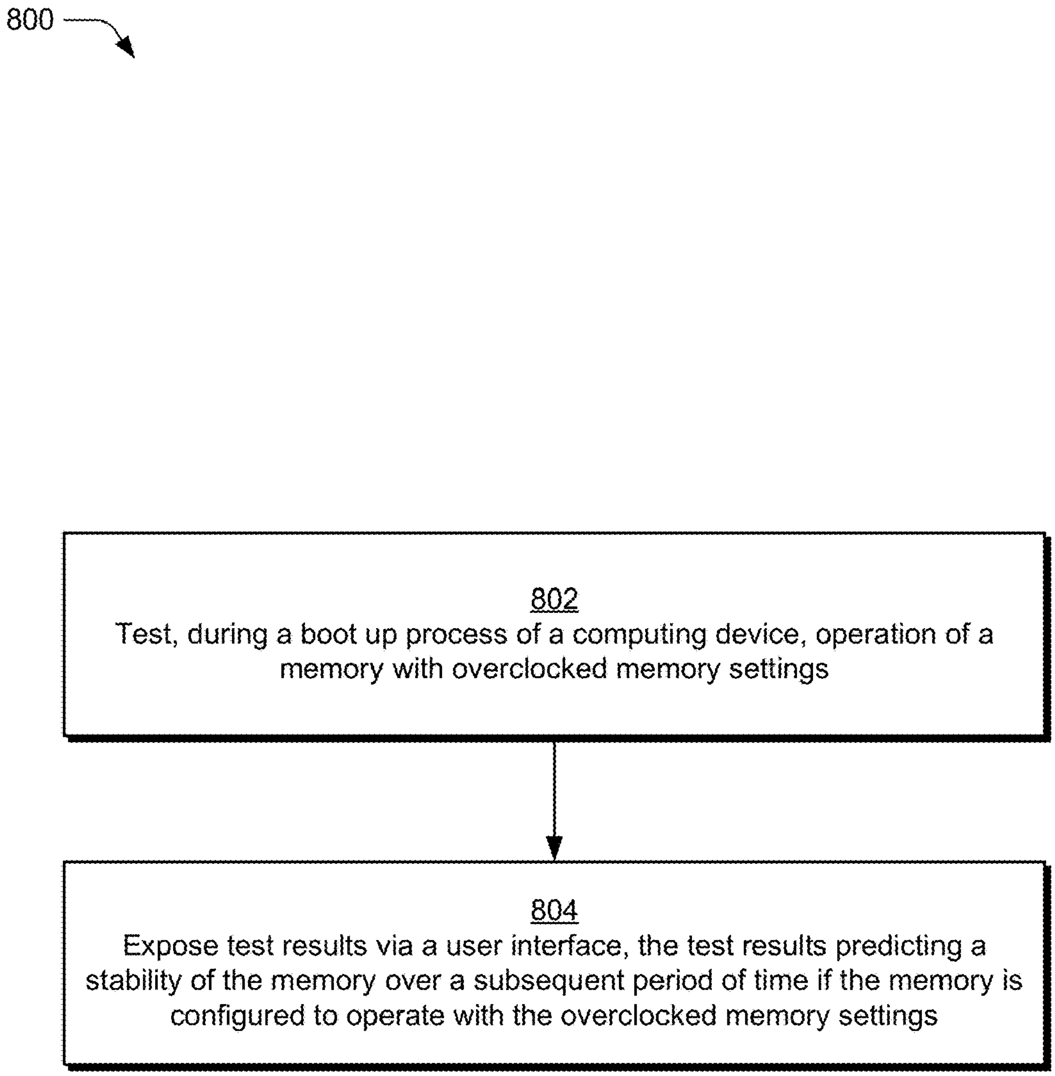
FIG. 8 depicts a procedure in an example implementation of stability testing for memory overclocking.

FIG. 8 depicts a procedure in an example 800 implementation of stability testing for memory overclocking.

Operation of a memory with overclocked memory settings is tested during a boot up process of a computing device (block 802). By way of example, memory controller 104 and/or another component of the system 100 (e.g., physical layer (PHY)) are configured to test stability of memory settings for operating the memory 102, such as testing a stability of the memory settings 116 of one or more non-overclocking memory profiles 112 and/or the overclocked memory settings 118 of one or more overclocking memory profiles 114. In at least one variation, the memory controller 104 tests a stability of a set of the overclocked memory settings 118 for operating the memory 102 (e.g., an overclocking memory profile 114) during a boot up process of the system 100. For example, user input specifying one or more settings of a set of overclocked memory settings 118 is received and further user input selecting to test the specified settings is then received.

Test results that predict a stability of the memory over a subsequent time period if the memory is configured to operate with the overclocked memory settings are exposed via a user interface (block 804). By way of example, after performing one or more tests on the memory 102, test results 122 indicating a stability of the tested settings are returned. In one or more implementations, human-understandable information indicative of the test results 122 (e.g., one or more scores) is presented (e.g., displayed) via a user interface as discussed in more detail below. Generally, the test results predict a stability of the memory over a subsequent time period if the memory is configured to operate with the set of overclocked memory settings.

It should be understood that many variations are possible based on the disclosure herein. Although features and elements are described above in particular combinations, each feature or element is usable alone without the other features and elements or in various combinations with or without other features and elements.

The various functional units illustrated in the figures and/or described herein (including, where appropriate, the memory 102, the memory controller 104, and the processing unit 106) are implemented in any of a variety of different manners such as hardware circuitry, software or firmware executing on a programmable processor, or any combination of two or more of hardware, software, and firmware. The methods provided are implemented in any of a variety of devices, such as a general purpose computer, a processor, or a processor core. Suitable processors include, by way of example, a general purpose processor, a special purpose processor, a conventional processor, a digital signal processor (DSP), a graphics processing unit (GPU), a parallel accelerated processor, a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine.

In one or more implementations, the methods and procedures provided herein are implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A system comprising:
- a memory; and
- a memory controller configured to:
  - receive a test request to test specified overclocked memory settings that comprise values of memory settings specified for testing stability of the memory operated using the specified overclocked memory settings;
  - responsive to the test request, power off the system and initiate a boot up process of the system;
  - during the boot up process of the system, directly access the memory to test operation of the memory with the specified overclocked memory settings, including testing different voltage or delay levels for different bits of the memory; and
  - output test results based on the testing.

2. The system of claim 1, wherein the test results predict the stability of the memory if the memory is configured to operate with the specified overclocked memory settings.

3. The system of claim 1, wherein the memory controller is configured to test the operation of the memory with the specified overclocked memory settings by performing at least one of reference voltage (Vref) or delay-locked loop (DLL) shmoos.

4. The system of claim 1, wherein the memory controller is configured to test the operation of the memory with the specified overclocked memory settings by generating one or more eye diagrams of the memory.

5. The system of claim 1, wherein the memory controller is configured to output the test results by communicating the test results to an operating system to enable the operating system to display the test results via a user interface.

6. The system of claim 1, wherein the test results include a score indicative of the test results.

7. The system of claim 1, wherein the test results include a graph or chart depicting the stability of the memory over time if the memory is configured to operate with the specified overclocked memory settings.

8. The system of claim 1, wherein the test results include a recommendation to adjust one or more parameters of the specified overclocked memory settings to improve the stability of the memory over a subsequent period of time.

9. A method comprising:

receiving a test request to test specified overclocked memory settings that comprise values of memory settings specified for testing stability of a memory operated using the specified overclocked memory settings;

directly accessing the memory by a memory controller to test, during a boot up process of a computing device and in response to receiving the test request, operation of the memory with the specified overclocked memory settings, including testing one or more portions of the memory for rowhammering; and exposing test results via a user interface, the test results predicting the stability of the memory over a subsequent time period if the memory is configured to operate with the specified overclocked memory settings.

10. The method of claim 9, wherein the test results include a score indicative of the test results.

11. The method of claim 9, wherein the test results include a graph or chart depicting the stability of the memory over time if the memory is configured to operate with the specified overclocked memory settings.

12. The method of claim 9, wherein the test results include a recommendation to adjust one or more parameters of the specified overclocked memory settings to improve the stability of the memory over the subsequent time period.

13. The method of claim 9, wherein overclocked memory settings are based on user input specifying the overclocked memory settings.

14. The method of claim 13, wherein the testing occurs responsive to receiving the test request to test the operation of the memory with the specified overclocked memory settings via user input to the user interface.

15. The method of claim 9, wherein the testing includes performing at least one of reference voltage (Vref) or delay-locked loop shmoos.

16. The method of claim 9, wherein the testing includes performing virtual timing and signal analysis.

17. An apparatus comprising:

a memory; and a memory controller configured to:

receive a test request to test specified overclocked memory settings that comprise values of memory settings specified for testing stability of the memory operated using the specified overclocked memory settings;

directly access the memory to test, during a boot up process of a computing device and in response to receiving the test request, operation of the memory with the specified overclocked memory settings by performing at least one of reference voltage (Vref) or delay-locked loop (DLL) shmoos; and expose test results via a user interface, the test results predicting the stability of the memory over a subsequent time period if the memory is configured to operate with the specified overclocked memory settings.

18. The apparatus of claim 17, wherein the memory settings include overclocked memory settings.

19. The apparatus of claim 18, wherein the overclocked memory settings are specified by a user.

20. The apparatus of claim 17, wherein the test results include a recommendation to adjust one or more parameters of the specified overclocked memory settings to improve the stability of the memory over the subsequent time period.

* * * * *